United States Patent [19]

Saito et al.

[11] Patent Number: 4,888,322
[45] Date of Patent: Dec. 19, 1989

[54] RECORDING MATERIAL CONTAINING LEUCO DYE

[75] Inventors: Naoki Saito; Toru Harada, both of Kanagawa, Japan

[73] Assignee: Fuji Photo Film Co., Ltd., Kanagawa, Japan

[21] Appl. No.: 229,681

[22] Filed: Aug. 8, 1988

[30] Foreign Application Priority Data

Jul. 8, 1987 [JP] Japan ................... 62-197740

[51] Int. Cl.$^4$ .................. B41M 5/16; B41M 5/18; G03C 1/40; G03C 1/72
[52] U.S. Cl. ..................... 503/215; 427/150; 427/151; 428/342; 428/913; 428/914; 430/138; 503/218
[58] Field of Search ................ 427/150–152; 428/342, 913, 914; 430/138; 503/213, 215, 217, 218

[56] References Cited

U.S. PATENT DOCUMENTS 4,011,352  3/1977  Janssens et al. ............ 503/218
4,025,089  5/1977  Garner et al. ............. 503/218

Primary Examiner—Bruce H. Hess
Attorney, Agent, or Firm—Mion, Zinn, Macpeak & Seas Sughrue

[57] ABSTRACT

A recording material comprises a layer which contains a leuco dye on a support. The leuco dye has the formula (I):

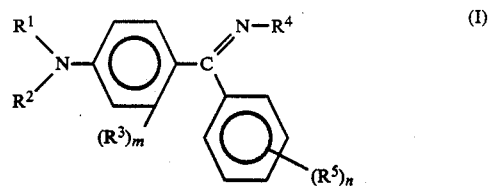

in which each of $R^1$ and $R^2$ independently is an alkyl group, a cycloalky group or an aryl group, or $R^1$ and $R^2$ may form, together with the neighboring nitrogen atom, a heterocyclic ring; $R^3$ is a halogen atom, an alkyl group, an aryl group, an alkoxy group or an aryloxy group; $R^4$ is an aryl group or a heterocyclic group; $R^5$ is a halogen atom, an acyloxy group, an acyl group, carbamoyl, sulfamoyl, an alkylsulfonylamino group, an arylsulfonylamino group, an acylamino group, amino, hydroxyl, nitro, cyano, an alkyl group, an aryl group, an alkoxy group, an aryloxy group, an alkoxycarbonyl group, an aryloxycarbonyl group, an alkysulfonyl group or an arylsulfonyl group; each of $R^1$, $R^2$, $R^3$, $R^4$ and $R^5$ may have one or more substituent groups; m is 0 or 1; n is 0, 1, 2, 3, 4 or 5; and when n is 2, 3, 4 or 5, the groups represented by $R^5$ may be different from each other.

12 Claims, No Drawings

RECORDING MATERIAL CONTAINING LEUCO DYE

FIELD OF THE INVENTION

This invention relates to a recording material such as a pressure-sensitive material, a heat-sensitive material and a light-sensitive material, and more particularly to a recording material containing a leuco dye.

BACKGROUND OF THE INVENTION

In various recording materials including pressure-sensitive, heat-sensitive and light-sensitive materials, a leuco dye is frequently used as a color image forming substance. The leuco dye, which is also referred to as a redox dye, develops a color on contact with an acid color developer.

The leuco dye is generally contained in microcapsules which are dispersed in a recording material. In an image forming process, the microcapsules are broken by external energy such as pressure and/or heat so that the dye comes into contact with the acid color developer which has been arranged outside of the microcapsules in the recording material.

Conventional leuco dyes which develop yellow are described in Japanese Patent Publications Nos. 45(1970)-4698, 50(1975)-24646, 51(1976)-27169 and 53(1978)-9127 and Japanese Patent Provisional Publication No. 49(1974)-4480. However, these leuco dyes do not satisfy the requirement with respect to color development. Further, the developed color tends to fade from the image.

SUMMARY OF THE INVENTION

An object of the present invention to provide a recording material which gives a yellow color image improved in the color density and the light fastness.

Another object of the invention is to provide a recording material containing a novel leuco dye which can rapidly develop the yellow color.

There is provided by the present invention a recording material comprising a layer containing a leuco dye on a support, wherein the leuco dye is a novel leuco dye having the formula (I):

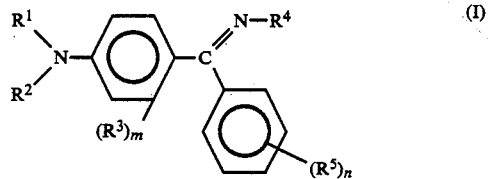

in which each of $R^1$ and $R^2$ independently is an alkyl group, a cycloalkyl group or an aryl group, or $R^1$ and $R^2$ may form, together with the neighboring nitrogen atom, a heterocyclic ring; $R^3$ is a halogen atom, an alkyl group, an aryl group, an alkoxy group or an aryloxy group; $R^4$ is an aryl group or a heterocyclic group; $R^5$ is a halogen atom, an acyloxy group, an acyl group, carbamoyl, sulfamoyl, an alkylsulfonylamino group, an arylsulfonylamino group, an acylamino group, amino, hydroxyl, nitro, cyano, an alkyl group, an aryl group, an alkoxy group, an aryloxy group, an alkoxycarbonyl group, an aryloxycarbonyl group, an alkylsulfonyl group or an arylsulfonyl group; each of $R^1$, $R^2$, $R^3$, $R^4$ and $R^5$ may have one or more substituent groups; m is 0 or 1; n is 0, 1, 2, 3, 4 or 5; and when n is 2, 3, 4 or 5, the groups represented by $R^5$ may be different from each other.

The present inventors have found that the novel leuco dye having the formula (I) is improved in not only the color developing rate but also the density and the light fastness of the developed color. Therefore, the leuco dye can be advantageously used as a color image forming substance (yellow color image forming substance) for a recording material.

The above-mentioned advantages of the novel leuco dye are remarkable when the leuco dye is used in a pressure-sensitive recording material or heat-sensitive recording material. Therefore, the recording material of the invention is advantageously used as the pressure-sensitive or heat-sensitive recording material.

DETAILED DESCRIPTION OF THE INVENTION

The leuco dyes employed in the present invention has the formula (I).

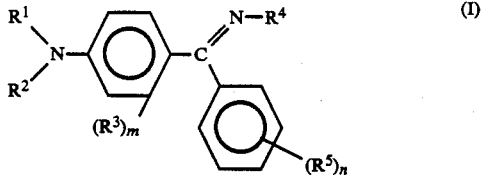

In the formula (I), each of $R^1$ and $R^2$ independently is a monovalent group selected from the group consisting of an alkyl group, a cycloalkyl group and an aryl group, or $R^1$ and $R^2$ may form, together with the neighboring nitrogen atom, a heterocyclic ring; $R^3$ is a monovalent group selected from the group consisting of a halogen atom, an alkyl group, an aryl group, an alkoxy group and an aryloxy group; $R^4$ is a monovalent group selected from the group consisting of an aryl group and a heterocyclic group; $R^5$ is a monovalent group selected from the group consisting of a halogen atom, an acyloxy group, an acyl group, carbamoyl, sulfamoyl, an alkylsulfonylamino group, an arylsulfonylamino group, an acylamino group, amino, hydroxyl, nitro, cyano, an alkyl group, an aryl group, an alkoxy group, an aryloxy group, an alkoxycaronyl group, an aryloxycarbonyl group, an alkylsulfonyl group and an arylsulfonyl group; each of $R^1$, $R^2$, $R^3$, $R^4$ and $R^5$ may have one or more substituent groups. m is 0 or 1; n is an integer of 0 to 5; and when n is 2, 3, 4 or 5, the groups represented by $R^5$ may be different from each other.

The alkyl group represented by $R^1$, $R^2$, $R^3$ and $R^5$ preferably has 1 to 22 carbon atoms, and more preferably has 1 to 12 carbon atoms. The alkyl group may be a straight chain or a branched chain and may have one or more substituent groups such as a halogen atom, an aryl group (e.g., phenyl), an alkoxy group and hydroxyl.

In the present specification and claims, the term of "alkyl group" include an aralkyl group (i.e., alkyl group substituted with an aryl group).

Examples of the cycloalkyl group represented by $R^1$ and $R^2$ include cyclopentyl, cyclohexyl, cycloheptyl and cyclooctyl. The cycloalkyl group may have one or more substituent groups such as a halogen atom, phenyl, an alkoxy group, hydroxyl and cyano.

Examples of the aryl group represented by $R^1$ to $R^5$ include phenyl, naphthyl, anthryl and phenanthryl.

Phenyl and naphthyl are preferred. The aryl group may have one or more substituent groups such as an alkyl group, an aryl group, a halogen atom, an alkoxy group, an aryloxyl group, an alkoxycarbonyl group, an aryloxycarbonyl group, an amido group, a sulfonyl group, carboxyl, an acyl group, hydroxyl, cyano, nitro, amino carbamoyl and sulfamoyl. The aryl group may be condensed with a heterocyclic ring.

The alkyl moiety of the alkoxy group represented by $R^3$ and $R^5$ have the same meanings as for the above-mentioned alkyl group represented by $R^1$, $R^2$, $R^3$ and $R^5$.

The aryl moiety of the aryloxy group represented by $R^3$ and $R^5$ have the same meanings as for the above-mentioned aryl group represented by $R^1$ to $R^5$.

Examples of the halogen atom represented by $R^3$ and $R^5$ are fluorine, chlorine, bromine and iodine. Fluorine and chlorine are preferred.

Examples of the heterocyclic group represented by $R^4$ include pyridyl, pyrimidyl, imidazolyl, thiazolyl, succinimide and hydantoyl (i.e., 2,5-dioxoimidazolidyl). The heterocyclic group may be condensed with benzene ring or naphthalene ring. Further, the heterocyclic group may be condensed with another heterocyclic ring, which may be furthermore combined with benzene ring or naphthalene ring. The heterocyclic ring represented by $R^4$ may have one or more substituent group such as a halogen atom, an alkyl group (having 1 to 10 carbon atoms), an alkoxy group (having 1 to 10 carbon atoms) and nitro.

The acyloxy group represented by $R^5$ has the following formula:

—OCOCR$^6$ in which $R^6$ has the same meanings as for $R^1$ and $R^2$ in the formula (I).

The acyl group represented by $R^5$ has the following formula:

—COR$^7$ in which $R^7$ has the same meanings as for $R^1$ and $R^2$ in the formula (I).

The carbamoyl and sulfamoyl represented by $R^5$ may have a substituent group such as an aryl group. The aryl group has the same meanings as for the above-mentioned aryl group represented by $R^1$ to $R^5$.

The alkyl moiety of the alkoxycarbonyl group and alkylsulfonyl group represented by $R^5$ has the same meanings as for the above-mentioned alkyl group represented by $R^1$, $R^2$, $R^3$ and $R^5$.

The aryl moiety of the aryloxycarbonyl group and arylsulfonyl group represented by $R^5$ has the same meanings as for the above-mentioned aryl group represented by $R^1$ to $R^5$.

The alkylsulfonylamino group and arylsulonylamino group represented by $R^5$ has the following formula:

—NR$^9$SO$_2$R$^8$ in which $R^8$ has the same meanings as for $R^1$ and $R^2$ in the formula (I); and $R^9$ is a monovalent group selected from the group consisting of hydrogen, an alkyl group and an aryl group (the alkyl group and aryl group have the same meanings as for the above-mentioned alkyl group and aryl group).

The acylamino group represented by $R^5$ has the following formula:

—NR$^{11}$COR$^{10}$ in which $R^{10}$ has the same meanings as for $R^1$ and $R^2$ in the formula (I); and $R^{11}$ is a monovalent group selected from the group consisting of hydrogen, an alkyl group and an aryl group (the alkyl group and aryl group have the same meanings as for the above-mentioned alkyl group and aryl group).

The amino represented by $R^5$ may have one or two substituent groups. The amino and substituted amino group have the following formula:

—N(R$^{12}$)$_2$ in which $R^{12}$ is a monovalent group selected from the group consisting of hydrogen, an alkyl group and an aryl group (the alkyl group and aryl group have the same meanings as for the above-mentioned alkyl group and aryl group); and the two groups represented by $R^{12}$ may be different from each other.

Two compounds having the formula (I) may be combined with each other to form a dimer. In the case that the dimer is formed, the group represented by $R^5$ preferably functions as a linking group for two monomers.

The leuco dye of the invention preferably has the following formula (II):

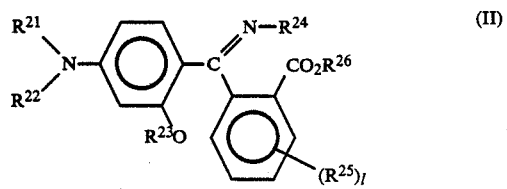

in which each of $R^{21}$, $R^{22}$, $R^{23}$ and $R^{26}$ independently is a monovalent group selected from the group consisting of an alkyl group, a cycloalkyl group and an aryl group, or $R^{21}$ and $R^{22}$ may form, together with the neighboring nitrogen atom, a heterocyclic ring; $R^{24}$ is a monovalent group selected from the group consisting of an aryl group and a heterocyclic group; $R^{25}$ is a monovalent group selected from the group consisting of a halogen atom, an alkyl group and an aryl group; each of $R^{21}$, $R^{22}$, $R^{23}$, $R^{24}$, $R^{25}$ and $R^{26}$ may have one or more substituent groups; l is 0, 1, 2, 3 or 4; and when l is 2, 3 or 4, the groups represented by $R^{25}$ may be different from each other.

The alkyl group represented by $R^{21}$, $R^{22}$, $R^{23}$, $R^{25}$ and $R^{26}$ preferably has 1 to 22 carbon atoms, and more preferably has 1 to 12 carbon atoms. The alkyl group may be a straight chain or a branched chain and may have one or more substituent groups such as a halogen atom, phenyl, an alkoxy group and hydroxyl.

Examples of the cycloalkyl group represented by $R^{21}$ and $R^{22}$ include cyclopentyl, cyclohexyl, cycloheptyl and cyclooctyl. The cycloalkyl group may have one or more substituent groups such as a halogen atom, phenyl, an alkoxy group, hydroxy and cyano.

Examples of the aryl group represented by $R^{21}$ to $R^{26}$ include phenyl, naphthyl, anthryl and phenanthryl. Phenyl and naphthyl are preferred. The aryl group may have one or more substituent groups such as an alkyl group, an aryl group, a halogen atom, an alkoxy group, an aryloxy group, an alkoxycarbonyl group, an aryloxycarbonyl group, an amido group, a sulfonyl group, carboxyl, an acyl group, hydroxyl, cyano, nitro, amino, carbamoyl and sulfamoyl. The aryl group may be condensed with the heterocyclic group.

Examples of the heterocyclic group represented by $R^{24}$ include pyridyl, pyrimidyl, imidazolyl, thiazolyl, succinimide and 2,4-dioxoimidazolidyl. The heterocyclic group may be condensed with benzene ring or naphthalene ring. Further, the heterocyclic group may be condensed with another heterocyclic ring, which may be furthermore combined with benzene ring or naphthalene ring. The heterocyclic ring represented by $R^{24}$ may have one or more substituent group such as a halogen atom, an alkyl group (having 1 to 10 carbon atoms), an alkoxy group (having 1 to 10 carbon atoms) and nitro.

Examples of the halogen atoms represented by $R^{25}$ are fluorine, chlorine, bromine and iodine. Fluorine and chlorine are preferred.

Examples of the leuco dyes which are preferably used in the invention are described hereinafter without limiting the invention.

(1)

(2)

(3)

-continued

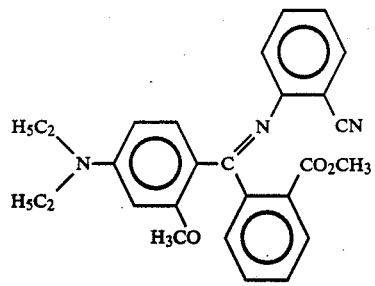
(4)

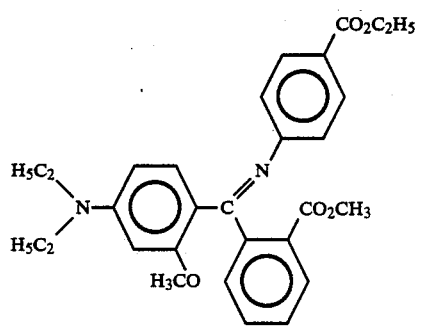
(5)

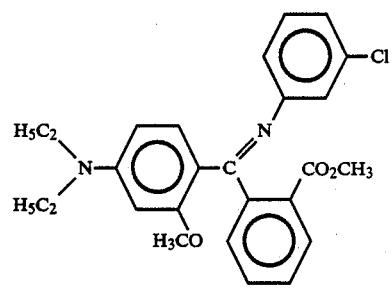
(6)

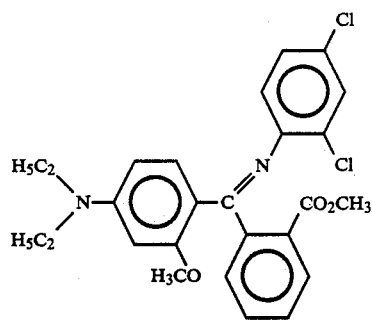
(7)

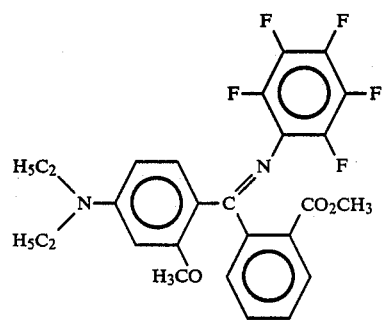
(8)

-continued
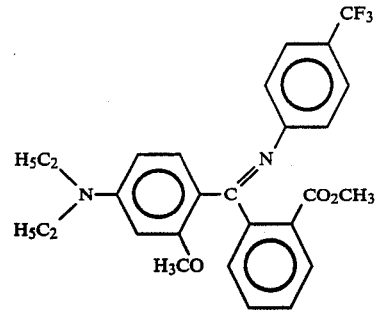 (9)
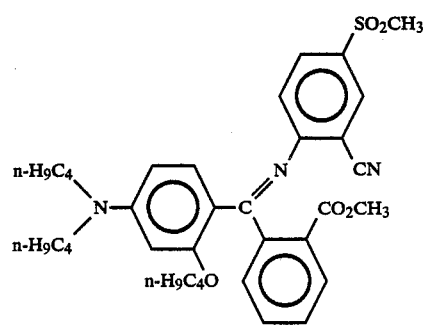 (10)
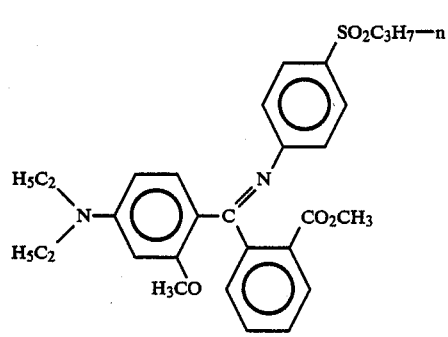 (11)
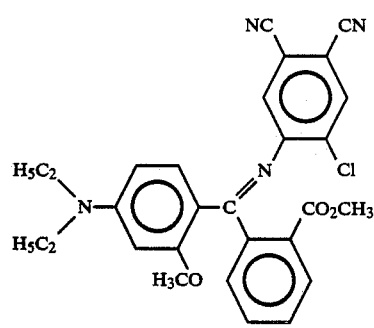 (12)
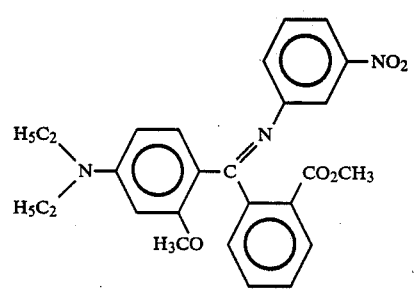 (13)
-continued
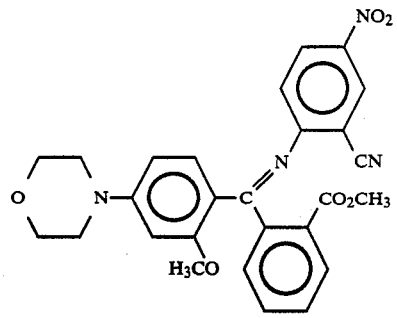 (14)
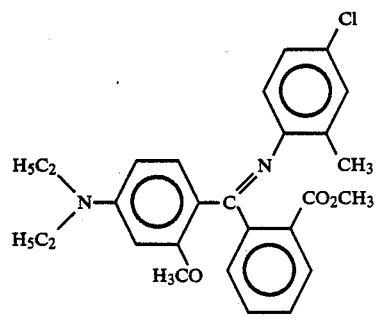 (15)
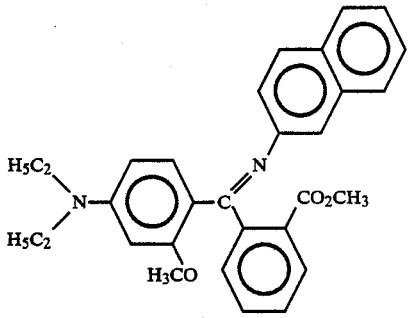 (16)
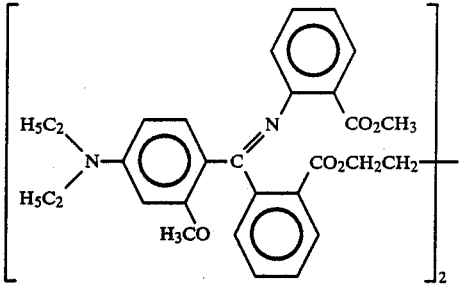 (17)
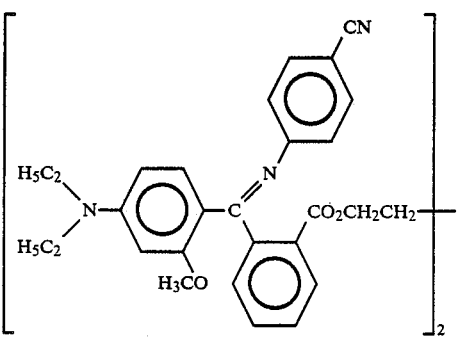 (18)

-continued
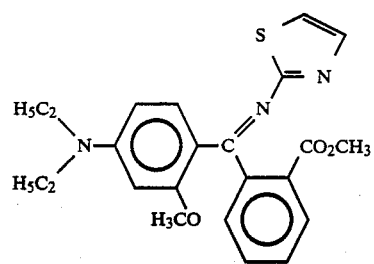 (19)
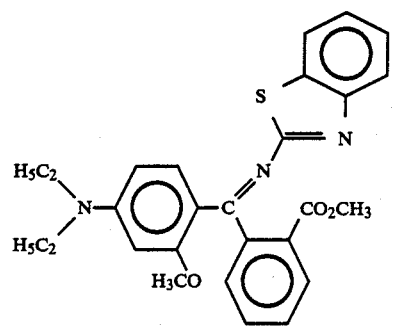 (20)
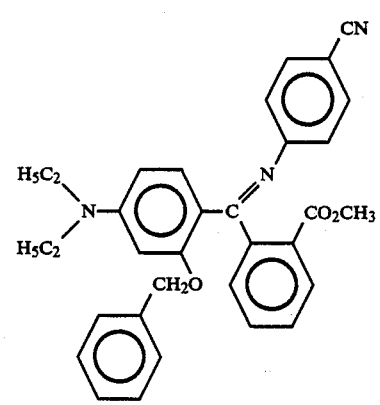 (21)
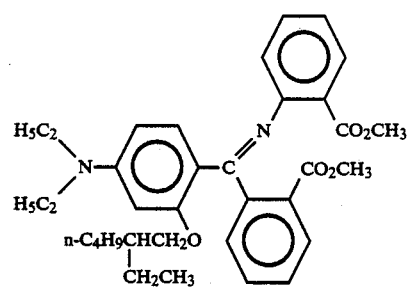 (22)
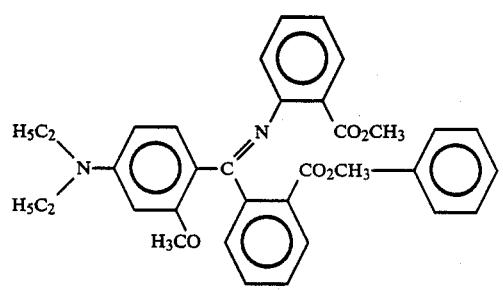 (23)
-continued
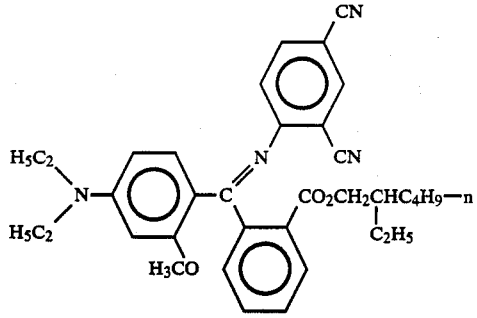 (24)
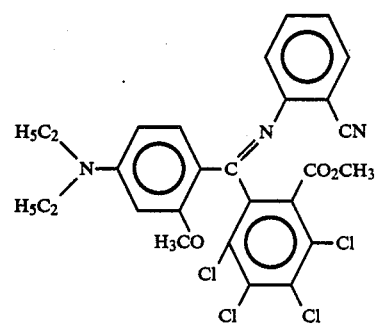 (25)
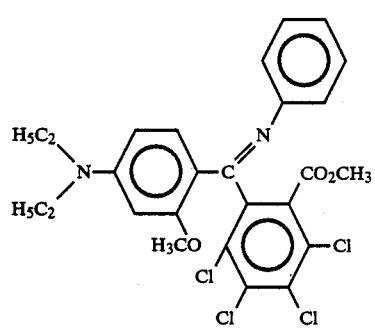 (26)
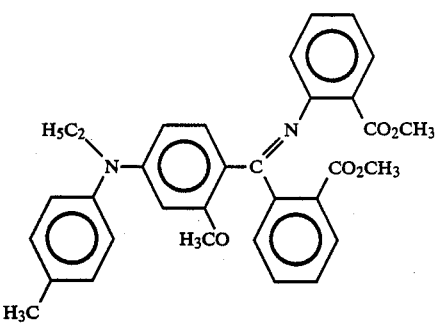 (27)
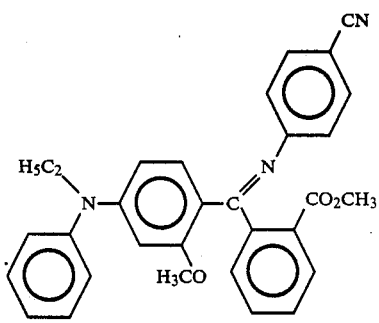 (28)

-continued

-continued

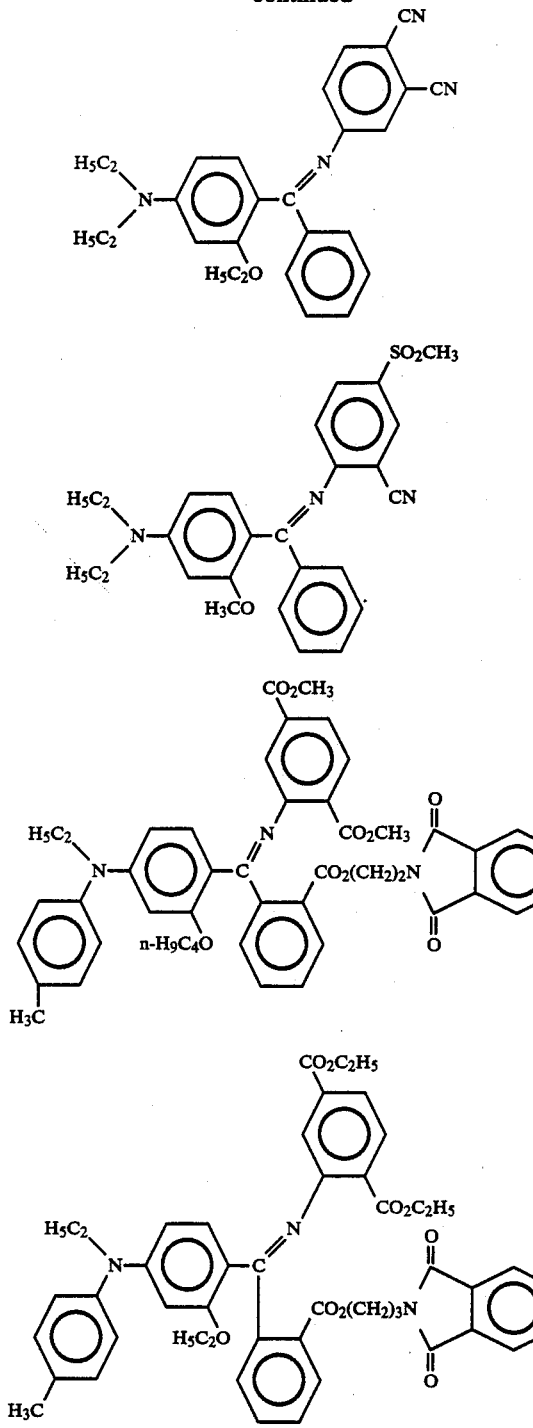

The leuco dyes used in the present invention can be easily synthesized according to the following synthesis examples.

SYNTHESIS EXAMPLE 1

Synthesis of leuco dye (1)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 1 minute while stirring in an iced water bath. The mixture was stirred for 20 minutes upon cooling, and 1.81 g of p-aminobenzonitrile was then added to the mixture. The mixture was further stirred for 30 minutes upon cooling. The reaction mixture was poured into water and extracted with ethyl acetate. The obtained organic phase was washed and dried, and then the solvent was evaporated to obtain a yellow oil.

In 25 ml of N,N-dimethylacetoamide was dissolved the obtained yellow oil. To the solution were added 1.90 ml of methyl iodide and 4.23 g of potassium carbonate, and the mixture was stirred at room temperature for 1 hour. The resulting mixture was poured into water and then was extracted with ethyl acetate. The obtained organic phase was washed and dried, and then the solvent was evaporated to obtain a yellow oil. The obtained product was crystallized out of methanol to obtain light yellow crystals of the leuco dye (1). The yield was 4.80 g, m.p. 126°–128° C.

SYNTHESIS EXAMPLE 2

Synthesis of leuco dye (2)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 2 minutes while stirring in an iced water bath. The mixture was stirred for 20 minutes upon cooling, and to the mixture was added 2.31 g of methyl anthranilate. The mixture was further stirred for 20 minutes upon cooling. The reaction mixture was poured into water and then was extracted with ethyl acetate. The obtained organic phase was washed and dried, and then the solvent was evaporated to obtain a yellow oil.

In 25 ml of N,N-dimethylacetoamide was dissolved the obtained yellow oil. To the mixture were added 1.86 ml of methyl iodide and 4.23 g of potassium carbonate, and the mixture was stirred at room temperature for 1 hour. The resulting mixture was poured into water and then was extracted with ethyl acetate. The obtained organic phase was washed and dried, and then the solvent was evaporated to obtain a yellow oil. The obtained product was purified using silica gel column chromatography to obtain a yellow oil of the leuco dye (2). The yield was 4.70 g.

SYNTHESIS EXAMPLE 3

Synthesis of leuco dye (3)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 1 minute while stirring in an iced water bath. The mixture was stirred for 20 minutes upon cooling, and to the mixture was added 2.19 g of 3,4-dicyanoaniline. The mixture was further stirred for 15 minutes upon cooling. The reaction mixture was poured into water and then was extracted with ethyl acetate. The obtained organic phase was washed and dried, and then the solvent was evaporated to obtain a yellow oil.

In 25 ml of N,N-dimethylacetoamide was dissolved the obtained yellow oil. To the mixture were added 1.86 ml of methyl iodide and 4.23 g of potassium carbonate, and the mixture was stirred at room temperature for 1 hour. The resulting mixture was poured into water and then was extracted with ethyl acetate. The obtained organic phase was washed and dried, and then the solvent was evaporated to obtain a yellow oil. The obtained product was crystallized out of methanol to obtain yellow crystals of the leuco dye (3). The yield was 5.00 g, m.p. 123°–126° C.

SYNTHESIS EXAMPLE 4

Synthesis of leuco dye (4)

In 25 ml of N,N-dimethylacetoamide was dissolved 5.00 g of 2-(4-diethylamino-2-methoxybenzoyl)benzoic acid. To the mixture was dropwise added 1.34 ml of thionyl chloride for 1 minute while stirring in an iced water bath. The mixture was stirred for 20 minutes upon cooling, and to the mixture was added 1.81 g of o-aminobenzonitrile. The mixture was further stirred for 30 minutes upon cooling. The reaction mixture was poured into water and then was extracted with ethyl acetate. The organic phase was washed and dried, and then the solvent was evaporated to obtain a yellow oil.

In 25 ml of N,N-dimethylacetoamide was dissolved the obtained yellow oil. To the mixture were added 1.90 ml of methyl iodide and 4.23 g of potassium carbonate, and the mixture was stirred at room temperature for 2 hours. The resulting mixture was poured into water and then was extracted with ethyl acetate. The obtained organic phase was washed and dried, and then the solvent was evaporated to obtain a yellow oil. The obtained product was crystallized out of methanol to obtain light yellow crystals of the leuco dye (4). The yield was 4.85 g, m.p. 131°–134° C.

SYNTHESIS EXAMPLE 5

Synthesis of leuco dye (5)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 1 minute while stirring in an iced water bath. The mixture was stirred for 15 minutes upon cooling, and to the mixture was added 2.53 g of p-aminobenzoic ethyl. The mixture was further stirred for 20 minutes upon cooling. The reaction mixture was poured into water and then was extracted with ethyl acetate. The obtained organic phase was washed and dried, and then the solvent was evaporated to obtain a yellow oil.

In 25 ml of N,N-dimethylacetoamide was dissolved the obtained yellow oil. To the mixture were added 1.90 ml of methyl iodide and 4.23 g of potassium carbonate, and the mixture was stirred at room temperature for 1 hour. The resulting mixture was poured into water and was then extracted with ethyl acetate. The obtained organic phase was washed and dried, and then the solvent was evaporated to obtain a yellow oil. The obtained product was purified using silica gel column chromatography to obtain a light yellow oil. The obtained substance was crystallized out of methanol to obtain a light-yellow crystal of the leuco dye (5). The yield was 6.17 g, m.p. 87°–89° C. SYNTHESIS EXAMPLE 6

Synthesis of leuco dye (6)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 2 minutes while stirring in an iced water bath. The mixture was stirred for 10 minutes upon cooling, and to the mixture was added 1.95 g of m-chloroaniline. The mixture was further stirred for 10 minutes upon cooling. The reaction mixture was poured into water and then was extracted with ethyl acetate. The obtained organic phase was washed and dried, and then the solvent was evaporated to obtain a yellow oil.

In 25 ml of N,N-dimethylacetoamide was dissolved the obtained yellow oil. To the mixture were added 0.792 ml of methyl iodide and 1.76 g of potassium carbonate, and the mixture was stirred at room temperature for 1 hour. The resulting mixture was poured into water and then was extracted with ethyl acetate. The obtained organic phase was washed and dried, and then the solvent was evaporated to obtain a yellow oil. The obtained product was purified using silica gel column chromatography to obtain a yellow oil of the leuco dye (6). The yield was 2.07 g.

SYNTHESIS EXAMPLE 7

Synthesis of leuco dye (10)

In 50 ml of N,N-dimethylacetoamide was dissolved 10.0 g of 2-(4-diethylamino-2-methoxybenzoyl)-benzoic acid. To the mixture was dropwise added 2.06 ml of thionyl chloride for 2 minute while stirring in an iced water bath. The mixture was stirred for 10 minutes upon cooling, and to the mixture was added 4.61 g of 2-cyano-4-methylsulfonylaniline for 2 minutes. The mixture was further stirred for 10 minutes upon cooling. The reaction mixture was poured into water and then was extracted with ethyl acetate. The obtained organic phase was washed and dried, and then the solvent was evaporated to obtain a yellow oil.

In 50 ml of N,N-dimethylacetoamide was dissolved the obtained yellow oil. To the mixture were added 2.20 ml of methyl iodide and 4.89 g of potassium carbonate, and the mixture was heated on a vapor bath for 10 minutes. The resulting mixture was poured into water and then was extracted with ethyl acetate. The obtained organic phase was washed and dried, and then the solvent was evaporated to obtain a yellowish red oil. The obtained product was crystallized out of methanol to obtain yellow crystals of the leuco dye (10). The yield was 8.49 g, m.p. 147°–150°0 C.

SYNTHESIS EXAMPLE 8

Synthesis of leuco dye (11)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 1 minute while stirring in an iced water bath. The mixture was stirred for 20 minutes upon cooling, and to the mixture was added 3.05 g of p-isopropylsulfonylaniline. The mixture was further stirred for 15 minutes upon cooling. The reaction mixture was poured into water and then was extracted with ethyl acetate. The obtained organic phase was washed and dried, and then the solvent was evaporated to obtain a yellow oil.

In 25 ml of N,N-dimethylacetoamide was dissolved the obtained yellow oil. To the mixture were added 1.90 ml of methyl iodide and 4.23 g of potassium carbonate, and the mixture was stirred at room temperature for 1 hour. The resulting mixture was poured into water and then was extracted with ethyl acetate. The obtained organic phase was washed and dried, and then the solvent was evaporated to obtain a yellow oil. The obtained product was purified using silica gel column chromatography to obtain a yellow oil of the leuco dye (11). The yield was 6.43 g.

SYNTHESIS EXAMPLE 9

Synthesis of leuco dye (13)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 2 minutes while stirring in an iced water bath. The mixture was stirred for 20 minutes upon cooling, and to the mixture was added 2.11 g of m-nitroaniline. The mixture was further stirred for 15 minutes upon cooling. The reaction mixture was poured into water and then was extracted with ethyl acetate. The obtained organic phase was washed and dried, and the solvent was evaporated to obtain a yellow oil.

In 25 ml of N,N-dimethylacetoamide was dissolved the obtained yellow oil. To the mixture were added 1.86 ml of methyl iodide and 4.23 g of potassium carbonate, and the mixture was stirred at room temperature for 1 hour. The resulting mixture was poured into water and then was extracted with ethyl acetate. The obtained organic phase was washed and dried, and then the solvent was evaporated to obtain a yellow oil. The obtained product was purified using silica gel column chromatography to obtain a yellow oil of the leuco dye (13). The yield was 4.33 g.

SYNTHESIS EXAMPLE 10

Synthesis of leuco dye (18)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 1 minute while stirring in an iced water bath. The mixture was stirred for 15 minutes upon cooling, and to the mixture was added 1.81 g of p-aminobenzonitrile. The mixture was further stirred for 20 minutes upon cooling. The reaction mixture was poured into water and then was extracted with ethyl acetate. The obtained organic phase was washed and dried, and then the solvent was evaporated to obtain a yellow oil.

In 25 ml of N,N-dimethylacetoamide was dissolved the obtained yellow oil. To the mixture were added 1.65 g of 1,4-dibromoethane and 4.23 g of potassium carbonate, and the mixture was stirred at room temperature for 2 hours. The resulting mixture was poured into water and then was extracted with ethyl acetate. The obtained organic phase was washed and dried, and then the solvent was evaporated to obtain a yellow oil. The obtained product was crystallized out of methanol to obtain yellow crystals of the leuco dye (18). The yield was 5.20 g, m.p. 164°–166° C.

SYNTHESIS EXAMPLE 11

Synthesis of leuco dye (19)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 1 minute while stirring in an iced water bath. The mixture was stirred for 20 minutes upon cooling, and to the mixture was added 1.53 g of 2-aminothiazole. The mixture was further stirred for 30 minutes upon cooling. The reaction mixture was poured into water and then was extracted with ethyl acetate. The obtained organic phase was washed and dried, and then the solvent was evaporated to obtain a yellow oil.

In 25 ml of N,N-dimethylacetoamide was dissolved the obtained yellow oil. To the mixture were added 1.90 ml of methyl iodide and 4.23 g of potassium carbonate, and the mixture was stirred at room temperature for 1 hour. The resulting mixture was poured into water and then was extracted with ethyl acetate. The organic phase was washed and dried, and then the solvent was evaporated to obtain a yellow oil. The obtained product was purified using silica gel column chromatography to obtain a yellow oil of the leuco dye (19). The yield was 4.21 g.

SYNTHESIS EXAMPLE 12

Synthesis of leuco dye (21)

In 35 ml of N,N-dimethylacetoamide was dissolved 7.00 g of 2-(4-diethylamino-2-methoxybenzoyl)-benzoic acid. To the mixture was dropwise added 1.52 ml of thionyl chloride for 1 minute while stirring in an iced water bath. The mixture was stirred for 20 minutes upon cooling, and to the mixture was added 2.04 g of p-aminobenzonitrile. The mixture was further stirred for 20 minutes upon cooling. The reaction mixture was poured into water and then was extracted with ethyl acetate. The obtained organic phase was washed and dried, and then the solvent was evaporated to obtain a yellow oil.

In 35 ml of N,N-dimethylacetoamide was dissolved the obtained yellow oil. To the mixture were added 2.15 ml of methyl iodide and 4.78 g of potassium carbonate, and the mixture was stirred at room temperature for 1 hour. The resulting mixture was poured into water and then was extracted with ethyl acetate. The obtained organic phase was washed and dried, and then the solvent was evaporated to obtain a yellowish red oil. The obtained product was recrystallized out of methanol to obtain light yellow crystals of the leuco dye (21). The yield was 6.80 g, m.p. 169°–170° C.

SYNTHESIS EXAMPLE 13

Synthesis of leuco dye (23)

In 25 ml of N,N-dimethylacetoamide was dissolved 5.00 g of 2-(4-diethylamino-2-methoxybenzoyl)-benzoic acid. To the mixture was dropwise added 1.34 ml of thionyl chloride for 2 minutes while stirring in an iced water bath. The mixture was stirred for 20 minutes upon cooling, and to the mixture was added 2.19 g of 3,4-dicyanoaniline. The mixture was further stirred for 15 minutes upon cooling. The reaction mixture was poured into water and then was extracted with ethyl acetate. The obtained organic phase was washed and dried, and then the solvent was evaporated to obtain a yellow oil.

In 25 ml of N,N-dimethylacetoamide was dissolved the obtained yellow oil. To the mixture were added 5.23 g of benzyl bromide and 4.23 g of potassium carbonate, and the mixture was stirred at room temperature for 1.5 hours. The resulting mixture was poured into water and then was extracted with ethyl acetate. The obtained organic phase was washed and dried, and then the solvent was evaporated to obtain a yellow oil. The obtained product was purified using silica gel column chromatography to obtain a yellow oil of the leuco dye (23). The yield was 8.49 g.

SYNTHESIS EXAMPLE 14

Synthesis of leuco dye (27)

In 30 ml of N,N-dimethylacetoamide was dissolved 6.00 g of 2-(4-diethylamino-2-methoxybenzoyl)-benzoic acid. To the mixture was dropwise added 1.35 ml of thionyl chloride for 2 minutes while stirring in an iced water bath. The mixture was stirred for 30 minutes upon cooling, and to the mixture was added 2.27 g of methyl anthranilate. The mixture was further stirred for 60 minutes upon cooling. The reaction mixture was poured into water and then was extracted with ethyl acetate. The obtained organic phase was washed and dried, and then the solvent was evaporated to obtain a yellow oil.

In 30 ml of N,N-dimethylacetoamide was dissolved the obtained yellow oil. To the mixture were added 1.90 ml of methyl iodide and 4.14 g of potassium carbonate, and the mixture was stirred at room temperature for 1 hour. The resulting mixture was poured into water and then was extracted with ethyl acetate. The obtained organic phase was washed and dried, and then the solvent was evaporated to obtain a yellow oil. The obtained product was purified using silica gel column chromatography to obtain a yellow oil of the leuco dye (27). The yield was 5.10 g.

SYNTHESIS EXAMPLE 15

Synthesis of leuco dye (37)

In 100 ml of xylene were dispersed 10.0 g of 4-diethylamino-2-methoxybenzophenone, 5.33 g of methyl anthranilate and 1.00 g of p-toluenesulfonate-hydrate, and the dispersion was refluxed for 20 hours in Dean-Stark apparatus while separating produced water. The reaction mixture was poured into water and then was extracted with ethyl acetate. The obtained organic phase was washed and dried, and then the solvent was evaporated to obtain a brown oil. The obtained product was purified using silica gel column chromatography to obtain a light yellow oil of the leuco dye (37). The yield was 2.55 g.

SYNTHESIS EXAMPLE 16

Synthesis of leuco dye (38)

In 100 ml of xylene were dispersed 10.0 g of 4-diethylamino-2-methoxybenzophenone, 6.82 g of p-amino benzoic isobuthyl and 1.00 g of p-toluenesulfonate-hydrate, and the dispersion was refluxed for 24 hours in Dean-Stark apparatus while separating produced water. The reaction mixture was poured into water and then was extracted with ethyl acetate. The obtained organic phase was washed and dried, and then the solvent was evaporated to obtain a brown oil. The obtained product was purified using silica gel column chromatography to obtain a yellow oil of the leuco dye (38). The yield was 2.76 g.

In the recording material of the invention, the leuco dye having the formula (I) may be used singly or in combination. Other leuco dyes can be used in combination with the leuco dye of the invention to obtain various kinds of color images, whether the other leuco dye has the same hue as that of the leuco dye of the invention or not. Examples of other leuco dyes include a triarylmethane compound, a diphenylmethane compound, a xanthene compound, a thiazine compound, a spiro-compound and mixtures of these compounds.

The leuco dye contained in the recording material of the invention develops a color on contact with an acid color developer. In the case that the acid color developer is also contained in the recording material of the invention, the developer is arranged out of contact with the leuco dye. For instance, the leuco dye is contained in microcapsules and the acid color developer is arranged outside of the microcapsules in the recording material. Alternatively, the leuco dye and the developer can be contained in separated layers respectively. In the image forming process, the recording material is pressed or heated so that the leuco dye comes into contact with the acid color developer. In another embodiment, the acid color developer can be contained in a material different from the recording material of the invention containing the leuco dye. In the image forming process, the recording material is pressed or heated on the material containing the developer so that the leuco dye comes into contact with the developer. In these embodiment, the acid color developer can be contained in microcapsules which are different from those containing the leuco dye.

In the case that the recording material of the invention is used as a light-sensitive material or a pressure-sensitive material, the leuco dye is preferably contained in microcapsules. More preferably, the acid color developer is contained in another layer which is different from the layer of the microcapsules. The layer containing the developer can be provided on a material (an image-receiving material or a developer sheet) different from the recording material of the invention. In the case that the microcapsules are employed as mentioned above, the obtained color image can be improved in the sensitivity and sharpness.

In the image forming process, the leuco dye preferably comes into contact with the acid color developer at an elevated temperature. The color forming reaction can be greatly accelerated by heating the leuco dye and the developer. Heating temperature for the reaction usually ranges from 50° C. to 200° C., and preferably from 50° C. to 150° C. The heating time is usually from 1 second to 1 minute, and preferably from 1 second to 10 seconds.

Examples of the acid color developers include an acid clay developer (e.g., China clay), phenol-formaldehyde resins (e.g., p-phenylphenol-formaldehyde resin), metal salts of salicylic acids (e.g., zinc 3,5-di-α-methylbenzyl salicylate), phenol-salicylic acid-formaldehyde resin (e.g., p-octylphenol-zinc salicylate-formaldehyde resin), zinc rhodanide and zinc xanthate.

Among them, the metal salts of the salicylic acids are preferred, and zinc salicylates are most preferred. It has been found that the reaction of the color formation of the leuco compound proceeds rapidly and effectively in the presence of zinc salicylates. The metal salts of the salicylates are described in more detail in Japanese Patent Publication No. 52(1977)-1327. The oil-soluble color developers containing zinc salicylates are described in U.S. Pat. Nos. 3,864,146 and 4,046,941.

The acid color developer is preferably used in an amount of from 50 to 1,000 weight % based on the amount of the leuco dye, and more preferably from 100 to 1,000 weight %.

The leuco dye of the present invention can be used in any of pressure-sensitive, heat-sensitive and light-sensitive materials. However, the advantages of the novel leuco dye are remarkable when the leuco dye is used in a pressure-sensitive recording material or heat-sensitive recording material. Therefore, the recording material of the invention is preferably used as a pressure-sensitive or heat-sensitive material.

The pressure-sensitive material of the invention is described in more detail hereinbelow.

The pressure-sensitive material generally comprises a layer (or sheet) containing the leuco dye and a layer (or sheet) containing the acid color developer. The sheet comprises a layer containing the leuco dye or the acid color developer provided on a support.

The layer containing the leuco dye preferably contains a binder. The leuco dye is preferably contained in microcapsules which are dispersed in the layer.

The microcapsules containing the leuco dye can be prepared in the following manner.

The leuco dye is dissolved or dispersed in an appropriate organic solvent and the resulting solution or dispersion (oil liquid) is emulsified in an aqueous medium.

The organic solvent preferably has a boiling point of not lower than 180° C., because of low-boiling organic silvent suffers an evaporation loss during storage. Examples of the organic solvents include an phosphoric ester, a phthalic ester, a carboxylic acid ester, a fatty acid amide, an alkylated biphenyl, an alkylated terphenyl, a chlorinated paraffin and a diarylethanol.

Concrete examples of the organic solvents include tricresyl phosphate, trioctyl phosphate, octyl diphenyl phosphate, tricyclohexyl phosphate, dibutyl phthalate, dioctyl phthalate, dilauryl phthalate, dicyclohexyl phthalate, butyl oleate, diethylene glycol dibenzoate, dioctyl sebacate, dibutyl sebacate, dioctyl adipate, trioctyl trimellitate, acetyltriethyl citrate, octyl maleate dibutyl maleate, isopropylbiphenyl, isoamylbiphenyl, chlorinated paraffin, diisopropylnaphthalene, 1,1'-ditolylethane, 2,4-di-tert-amylphenol and N,N-dibutyl-2-butoxy-5-tert-octylaniline. A vinyl compound can be also used as the organic solvent.

The leuco dye of the invention is preferably used in an amount of from 2 to 20 weight % based on the amount of the organic solvent.

The oil droplets in the emulsion is then processed for forming shell of the microcapsules.

There is no specific limitation on shell material of the microcapsule, and various known materials such as polymers can be employed as the shell material. Examples of the shell material include polyurethane, polyurea, polyamide, polyester, urea/formaldehyde resin, melamin resin, polystyrene, styrene/methacrylate copolymer, styrene/acrylate copolymer and mixtures thereof.

The microcapsule can be prepared by any of conventional methods without specific limitations. However an interfacial polymerization method and an internal polymerization method are preferred in the invention.

Where polyurea and/or polyurethane is used as the shell material of the microcapsule, a polyisocyanate is mixed with a second material capable of reacting with the polyisocyanate to form the shell (e.g., polyol or polyamine) in an aqueous medium or an oil liquid to be encapsulated and the mixture is emulsified and dispersed in water and then heated. Thus, a polymerization reaction takes place at the interface of oil droplets to form the shell of the microcapsule.

In the process for formation of the microcapsule, a water-soluble polymer can be used as a protective colloid. The water-soluble polymer is preferably anionic, nonionic or amphoteric.

The anionic polymer used as the protective colloid may be either a natural substance or a synthetic substance. The anionic polymer preferably has carboxyl group or sulfo group. Examples of the anionic polymers include natural substances such as gum arabic and alginic acid; semisynthetic substances such as carboxymethylcellulose, phthalated gelatin, sulfated starch, cellulose sulfate and lignin sulfonic acid; and synthetic substances such as a maleic anhydride copolymer and hydrolyis products thereof, a (meth)acrylic acid polymer and copolymers thereof, a vinylbenzene-sulfonic acid polymer and copolymers thereof and a carboxymodified polyvinyl alcohol. Examples of the nonionic polymers include polyvinyl alcohol, hydroxyethylcellulose and methylcellulose. An example of the amphoteric polymer is gelatin.

These water-soluble polymers (protective colloids) are preferably used in the form of an aqueous solution. The polymer is preferably contained in the solution in an mount of 0.01 to 10 weight %.

Examples of the binder which can be used in the layer containing the leuco dye include polyvinyl alcohol, methylcellulose, carboxymethylcellulose, hydroxypropylcellulose, gum arabic, gelatin, polyvinyl pyrrolidone, casein, styrene/butadiene latex, acrylonitrile/butadiene latex, polyvinyl acetate, polyacrylic ester and ethylene/vinyl acetate copolymer. The binders are preferably used in the form of an emulsion.

The binder is used in an amount of 0.5 to 5 g/m$^2$ on a solid basis.

The layer containing the leuco dye can be formed in such a manner that a microcapsule dispersion is mixed with a binder solution to prepare a coating solution and the coating solution is coated on a support according to a conventional coating method, such as bar coating, blade coating, air-knife coating, gravure coating, roll coating, spray coating and dip coating methods, and then dried.

The layer containing the leuco dye is usually provided in a range of 2.5 to 25 g/m$^2$ on a solid basis.

A paper support is preferably employed in the pressure sensitive material. A neutral paper having a pH of 6 to 9, which is measured according to a hot water extracting method, is preferably used as the paper support from the viewpoint of the storage stability of the recording material. The neutral paper support can be prepared, for instance, using a neutral size such as an alkylketene dimer. The surface of the paper support may be treated. The neutral paper support is described in more detail in Japanese Patent Provisional Publication No. 55(1980)-14281.

The layer (or sheet) containing the acid color developer can be formed in such a manner that an emulsion of the acid color developer is mixed with a binder to prepare a coating solution and the coating solution is coated on a support in a similar manner to that described above and then dried. The binder may be the same as that of the layer containing the leuco dye. The sheet containing the developer can be prepared using a different support from that of the pressure sensitive material.

The pressure-sensitive material containing a leuco dye is usually laminated on the sheet containing an acid color developer prior to use.

There are various embodiments other than that mentioned above. For instance, the leuco dye can be contained in different microcapsules from those containing the acid color developer and the two kinds of the microcapsules can be contained in the same layer (or sheet layer). In other embodiment, the leuco dye can be contained in a different layer from that containing the acid color coupler and both layers are provided on the same support. In this embodiment, the pressure-sensitive material has a multilayer structure.

In the recording process employing the pressure-sensitive material of the present invention, external pressure, for instance handwriting or typewriting pressure breaks the microcapsules and releases the leuco dye, which reacts with the acid color developer to produce visible color.

The heat-sensitive material (thermal recording material) of the invention is described in more detail hereinbelow.

The heat-sensitive material has basically the same structure as that of the aforementioned pressure-sensitive material. The heat-sensitive recording material comprises a heat-sensitive layer (thermal recording layer) provided on a support. The leuco dye of the invention contained in the heat-sensitive layer. The acid color developer is preferably contained in the same layer as that of the leuco dye in consideration of saving thermal energy required for thermal response and color formation. The leuco dye is preferably contained in microcapsules which are dispersed in the heat-sensitive layer.

The shell material of the microcapsule preferably is a polymer which is impermeable at room temperature and becomes permeable at an elevated temperature. The polymer more preferably has a glass transition temperature of from 60° to 200° C. The shell material most preferably is polyurea or polyurethane.

The thermal recording process employing the heat-sensitive material of the invention is carried out, for instance, in the following manner.

The heat-sensitive material is arranged such that it is in contact with a heating element (printing head) such as thermal needle or thermal head. The heating element is heated in series corresponding to electric signals having image information transmitted from facsimile or electronic computer, and it scans the heat-sensitive material in a direction at the same time while it is in contact with the material. When the heat-sensitive material is moved in a direction perpendicular to the scanning direction of the heating element, a two-dimensional printing or image can be formed on the heat-sensitive material.

While the typical recording material of the invention has been described above, the recording material of the invention can be used as other recording materials such as a light-sensitive material, an electrothermal recording sheet, an ultrasonic recording sheet, an electron beam recording material and an electrostatic recording material.

Examples of the light-sensitive materials include a recording sheet comprising a photosensitive resin (e.g., a photoresist material for presensitized lithographic plate) and a light-sensitive material comprising a light-sensitive layer containing silver halide, a reducing agent and an ethylenic unsaturated polymerizable compound provided on a support, which is described in Japanese Patent Provisional Publication No. 61(1986)-69026 (corresponding to U.S. Pat. No. 4,629,676) as well as a conventional silver salt photo-sensitive material. In the light-sensitive material containing silver halide, a reducing agent and a polymerizable compound, the leuco dye and the polymerizable compound are preferably contained in microcapsules which are dispersed in the light-sensitive layer, while the acid color developer is preferably contained in an image-receiving material. The light-sensitive material is pressed on the image-receiving material after exposing and developing.

The microcapsules containing the leuco dye, which are used in the pressure-sensitive, heat-sensitive or light-sensitive materials, can be prepared by various known methods. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyderesorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the leuco dye and forming a polymeric membrane (i.e., shell) over the core materials.

In the above-mentioned recording materials, the leuco dye of the present invention is preferably used in a coating amount of 0.01 to 1 g/m², and more preferably used in a coating amount of 0.03 to 0.3 g/m².

The present invention is further described by the following examples without limiting the invention thereto. In the following examples, "part(s)" means "part(s) by weight", unless otherwise indicated.

EXAMPLE 1

Preparation of pressure-sensitive material

In 95 parts of hot water at about 80° C. was dissolved 5 parts of partial sodium salt of polyvinylbenzenesulfonic acid (VERSA, TL500, average molecular weight; 500,000; produced by National Starch Co.) while stirring over 30 minutes. The aqueous solution was then cooled. The resulting aqueous solution having a pH of from 2 to 3 was adjusted to pH of 4.0 using 20 weight % aqueous solution of sodium hydroxide.

In 100 parts of the obtained 5% aqueous solution of partial sodium salt of polyvinylbenzenesulfonic acid was emulsified 100 parts of 3.5 weight % diisopropylnaphthalene solution of the following leuco dye (1) to obtain an emulsion having oily droplets of average droplet size of 4.5 μm.

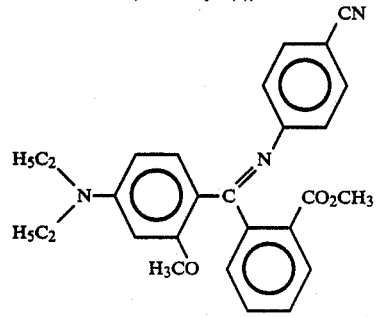

(Leuco dye (1))

Separately, 6 parts of melamine, 11 parts of 37 weight % aqueous solution of formaldehyde and 30 parts of water were heated to 60° C. while stirring. After 30 minutes, a clear aqueous solution of a mixture (precondensate) of melamine, formaldehyde and a malamineformaldehyde precondensate was obtained. The aqueous solution had a pH of 6 to 8.

To the emulsion was added the precondensate solution obtained above. The resulting mixture was adjusted to pH of 6.0 using 3.6 weight % aqueous solution of phosphoric acid while stirring. The mixture was then heated to 65° C. while stirring for 6 hours to obtain a microcapsule dispersion. The dispersion was then cooled to room temperature and adjusted to pH of 9.0 using 20 weight % aqueous solution of sodium hydroxide.

To the microcapsule dispersion were added 200 parts of 10 weight % aqueous solution of polyvinyl alcohol (PVA-117, produced by Kuraray Co., Ltd.) and 50 parts of starch particles. To the mixture was further added water to obtain a coating solution having solid content of 20%. The coating solution was coated on the surface of a base paper sheet having basis weight of 50 g/m² in coating amount of 5 g/m² based on the solid content using an air-knife coater and then dried to obtain a pressure-sensitive material (I).

Preparation of sheet containing acid color developer

To 20 parts of 1-isopropylphenyl-2-phenylethane was added 10 parts of zinc 3,5-bis-α-methylbenzylsalicylate, and the mixture was heated at 90° C. to obtain a solution. The solution was added to 50 parts of 2 weight % aqueous solution of polyvinyl alcohol (PVA-117; produced by Kuraray Co., Ltd.) and 0.1 part of 10% aqueous solution of triethanolamine dodecylbenzenesulfonate (surfactant) was further added to the mixture. The resulting mixture was stirred using a homogenizer to obtain an emulsion having average droplet size of 3 μm.

A dispersion containing 80 parts of calsium carbonate and 20 parts of zinc oxide was prepared using kedy mill, and to the emulsion was mixed the dispersion. To the mixture were further added 100 parts of 10 weight % aqueous solution of polyvinyl alcohol (PVA-117; produced by Kuraray Co., Ltd.) as binder and 10 parts of a carboxy-modified SBR latex (SN-307; produced by Sumitomo Naugatax Co.) as solid content. To the mixture was then added water to obtain a coating solution (A) having solid content of 20%.

Separately, a mixture containing 10 parts of zinc 3,5-bis-α-methyl-benzylsalicylate, 20 parts of silton clay, 60 parts of calcium carbonate, 20 parts of zinc oxide, 1 part of sodium hexametaphosphate and 200 parts of water was stirred using a sand grinder to obtain a dispersion having average particle size of 3 μm.

To the resulting dispersion was added 16 parts of a 10 weight % aqueous solution of polyvinyl alcohol (PVA-103; produced by Kuraray Co., Ltd.). To the mixture were added 100 parts of 10 weight % aqueous solution of polyvinyl alcohol (PVA-117; produced by Kuraray Co., Ltd.) and 10 parts of carboxy-modified SBR latex (SN-307; produced by Sumitomo Naugatax Co.) as solid content. To the mixture was then added water to obtain a coating solution (B) having solid content of 20%.

The coating solution (A) was mixed with the coating solution (B) in the ratio of 50 (A) to 50 (B) in terms of the amount of acid color developer. The mixture was coated on the surface of a base paper sheet having basis weight of 50 g/m² in coating amount of 5.0 g/m² based on the solid content using an air-knife coater and then dried to obtain a sheet containing acid color developer.

EXAMPLES 2 to 10

Pressure sensitive recording sheets (II) to (X) were prepared in the same manner as in Example 1, except that the following leuco dyes (2), (3), (4), (5), (17), (27), (33), (35) and (38) were respectively used in place of the leuco dye (1).

(Leuco dye (2))

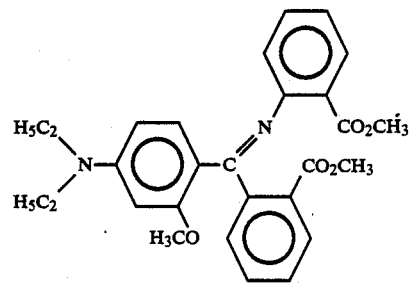

(Leuco dye (3))

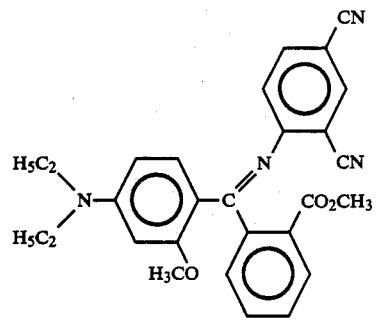

(Leuco dye (4))

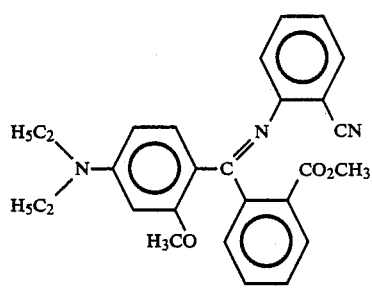

(Leuco dye (5))

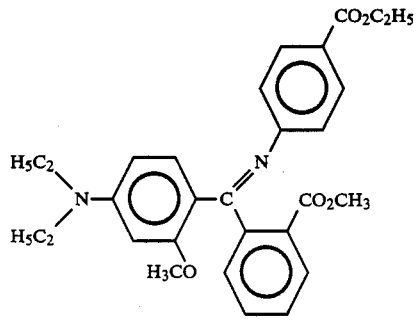

(Leuco dye (17))

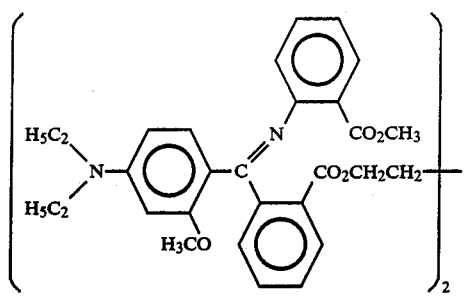

(Leuco dye (27))

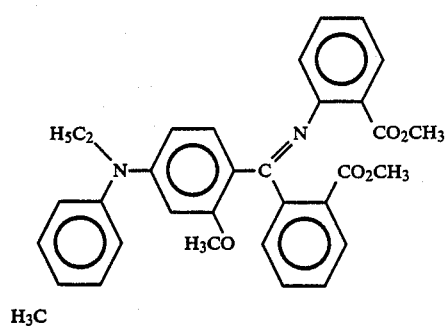

(Leuco dye (33))

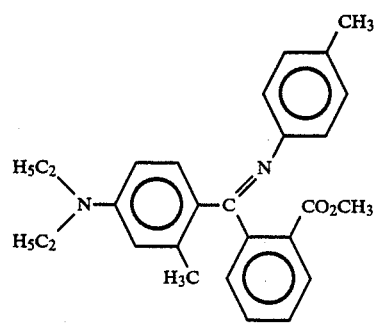

(Leuco dye (35))

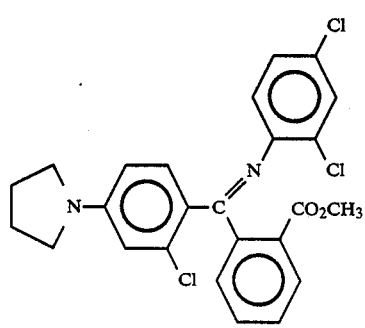

(Leuco dye (38))

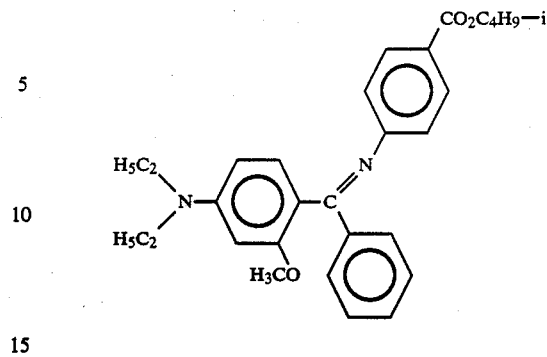

COMPARISON EXAMPLES 1 & 2

Pressure-sensitive recording sheets (XI) and (XII) were prepared in the same manner as in Example 1 except that the following conventional leuco dyes (a) and (b) were respectively used in place of the leuco dye (1).

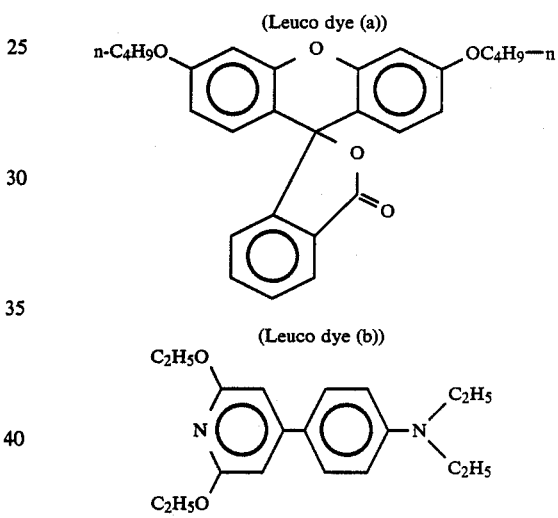

Evaluation of pressure-sensitive material

Each of the pressure-sensitive materials (I) to (XII) prepared in Examples 1 to 10 and Comparison Examples 1 & 2 was pressed on the sheet containing an acid color developer and the density of the each of the yellow images obtained on the sheet was measured using a reflection densitometer.

Further, the light fastness of the obtained image was evaluated according to the following manner.

Each of the yellow images was irradiated with light using a xenon lamp at 80,000 lux for 3 hours. And then, the discoloration was evaluated measuring the density of the remaining color image and comparing the density with that before the irradiation.

The results are set forth in Table 1. In Table 1, "Remaining Ratio after Irradiation" means the ratio of the density of the color image after the irradiation to that before the irradiation.

TABLE 1

| | Pressure-Sensitive Material | Leuco Dye | Color Density | Remaining Ratio after Irradiation |
|---|---|---|---|---|
| Example 1 | (I) | (1) | 1.31 | 95% |
| Example 2 | (II) | (2) | 1.25 | 94% |

TABLE 1-continued

| | Pressure-Sensitive Material | Leuco Dye | Color Density | Remaining Ratio after Irradiation |
|---|---|---|---|---|
| Example 3 | (III) | (3) | 1.23 | 96% |
| Example 4 | (IV) | (4) | 1.20 | 92% |
| Example 5 | (V) | (5) | 1.21 | 91% |
| Example 6 | (VI) | (17) | 1.24 | 93% |
| Example 7 | (VII) | (27) | 1.26 | 93% |
| Example 8 | (VIII) | (33) | 1.19 | 82% |
| Example 9 | (IX) | (35) | 1.22 | 87% |
| Example 10 | (X) | (38) | 1.07 | 90% |
| Comp. Ex. 1 | (XI) | (a) | 0.54 | 79% |
| Comp. Ex. 2 | (XII) | (b) | 0.72 | 63% |

It is apparent from the results in Table 1 that each of the pressure-sensitive materials (I) to (X) according to the invention forms an improved color image which has a high maximum density as compared with the pressure-sensitive materials (XI) and (XII) containing a conventional leuco dye. Further, it is observed that the color developing rate and the light fastness are also improved.

EXAMPLE 11

Preparation of silver halide emulsion

In 1,000 ml of water were dissolved 20 g of gelatin and 3 g of sodium chloride, and the resulting gelatin solution was kept at 75° C. to the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, a mean grain size of 0.35 μm and a bromide content of 80 mole %.

The emulsion was washed for desalting and then subjected to chemical sensitization with 5 mg of sodium thiosulfate and 20 mg of 4-hydroxy-6-methyl-1,3,3a,7-tetraazaindene at 60° C. The yield of the emulsion was 600 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of light-sensitive composition

In 100 g of trimethylolpropane triacrylate were dissolved 0.40 g of the following copolymer, 6.64 g of the following leuco dye (1) and 2 g of Emulex NP-8 (tradename of Nippon Emulsion Co., Ltd.).

(Copolymer)

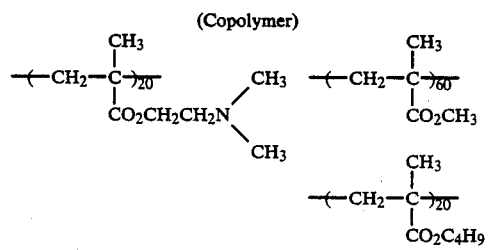

(Leuco dye (1))

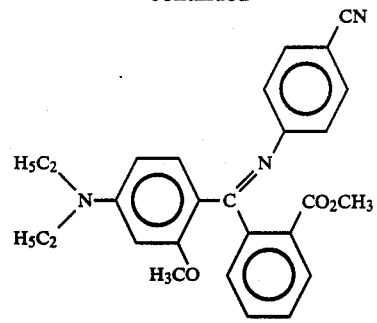

To 18.00 g of the resulting solution was added a solution in which 0.16 g of the following reducing agent (I) and 1.22 g of the following reducing agent (II) are dissolved in 1.80 g of methylene chloride.

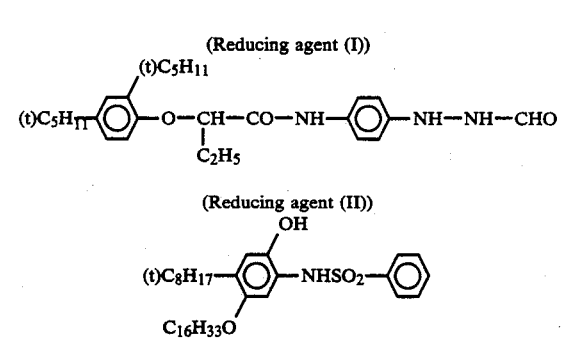

To the mixture were further added 3.50 g of the silver halide emulsion and 3.35 g of the silver benzotriazole emulsion, and the mixture was stirred at 15,000 r.p.m. for 5 minutes to obtain a light-sensitive composition.

Preparation of light-sensitive microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 of 37% aqueous solution of formaldehyde, and 2.74 g of 8.76% aqueous solution of ammonium sulfate in this order, and the mixture was heated at 60° C. for 2 hours while stirring. After the mixture was adjusted to a pH of 7.0 using 10% aqueous solution of sodium hydroxide, 3.62 g of 30.9% aqueous solution of sodium hydrogen sulfite was added to the mixture to obtain a dispersion containing light-sensitive microcapsules.

Preparation of light-sensitive material

To 10.0 g of the light-sensitive microcapsule dispersion were added 1.0 g of 1% aqueous solution of the following anionic surfactant and 1.0 g of 10% solution (solvent: water/ethanol=50/50 as volume ratio) of guanidine trichroloacetate to prepare a coating solution.

(Anionic surfactant)

-continued

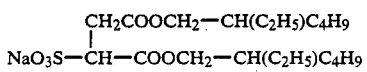

The coating solution was uniformly coated on a polyethyleneterephthalate film (thickness: 100 μm) using a coating rod of #40 to give a layer having a wet thickness of 70 μm and dried at about 40° C. to obtain a light-sensitive material (A).

EXAMPLE 12

Light-sensitive materials (B) to (L) were prepared in the same manner as in Examples 11 except that the following leuco dyes (2), (3), (4), (5), (17), (27), (33), (35), (38), (41) and (42) were respectively used in place of the leuco dye (1).

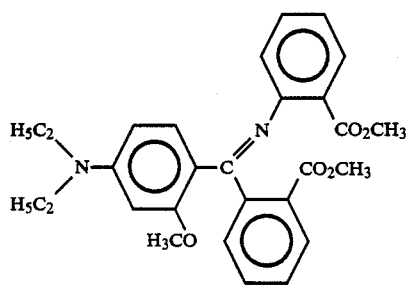

(Leuco dye (2))

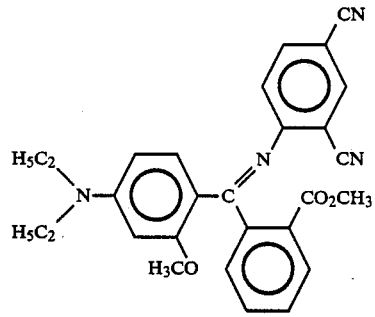

(Leuco dye (3))

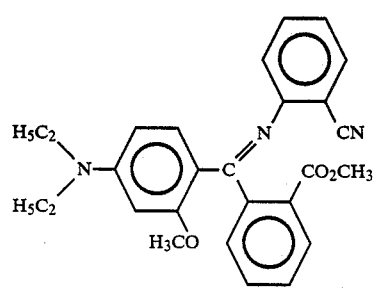

(Leuco dye (4))

(Leuco dye (5))

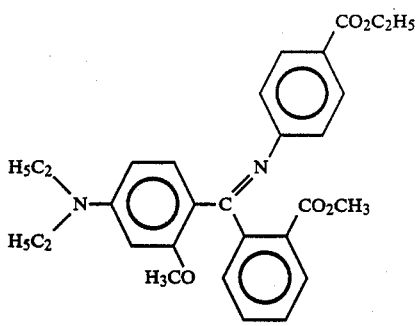

(Leuco dye (17))

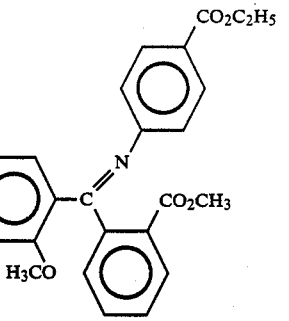

(Leuco dye (27))

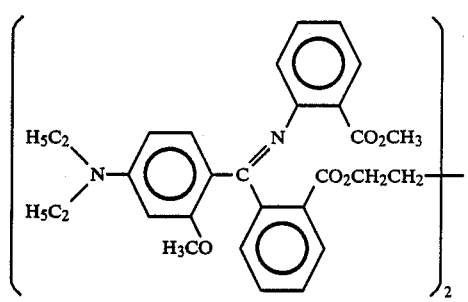

(Leuco dye (33))

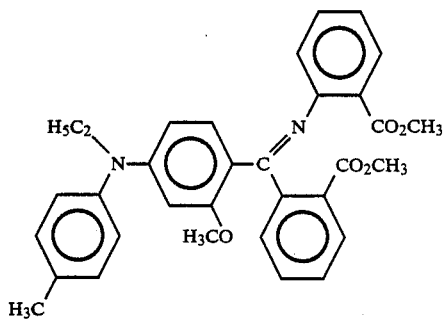

(Leuco dye (35))

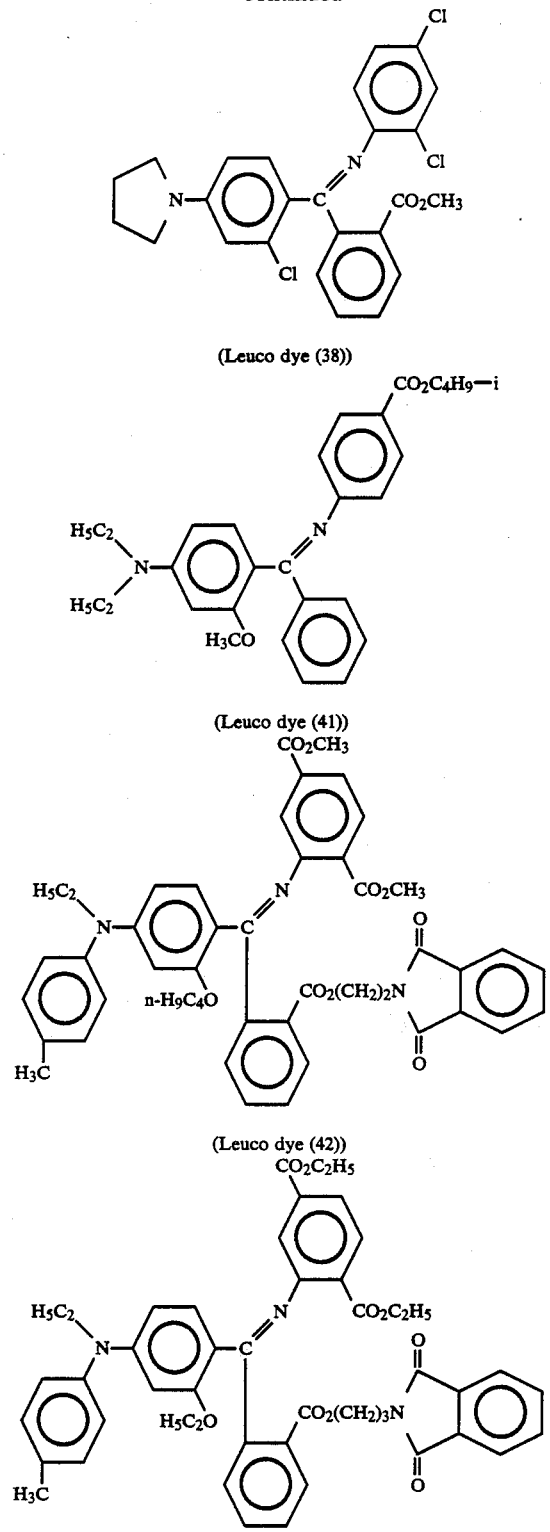

(Leuco dye (38))

(Leuco dye (41))

(Leuco dye (42))

COMPARISON EXAMPLE 3

Light-sensitive materials (M) and (N) were prepared in the same manner as in Example 11 except that the following leuco dyes (a) and (b) were respectively used in place of the leuco dye (1).

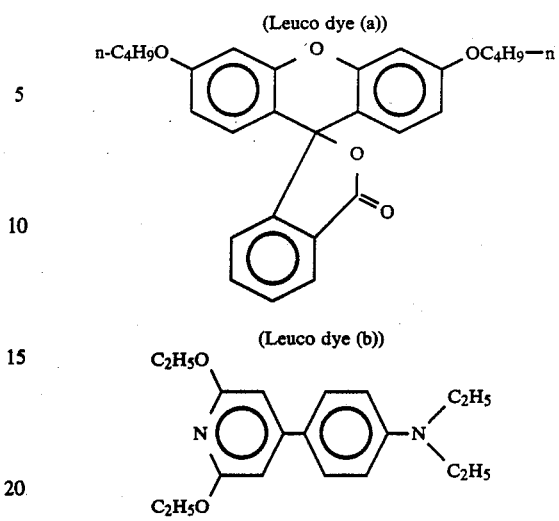

(Leuco dye (a))

(Leuco dye (b))

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer.

The coarse dispersion was then finely dispersed in Dynomill dispersing device. To 200 g of the resulting dispersion were added 6 g of 50% latex of SBR (styrenebutadiene rubber) and 55 g of 8% aqueous solution of polyvinyl alcohol, and the resulting mixture was made uniform. The mixture was then uniformly coated on an art paper having a basis weight of 43 g/m² to give a layer having a wet thickness of 30 μm and dried to obtain an image-receiving material.

Evaluation of light-sensitive material

Each of the light-sensitive materials (A) to (N) prepared in Examples 11 & 12 and Comparison Example 3 was imagewise exposed to light using a tungsten lamp at 200 lux for 1 second and then heated on a hot plate at 125° C. for 30 seconds. Each of the exposed and heated light-sensitive materials was then combined with the image-receiving material and passed through press rolls under pressure of 350 kg/cm². The maximum density of the positive color image (yellow color image) obtained on the image-receiving material was measured using a reflection densitometer.

Further, the durability to exposure to light of the obtained image was evaluated according to the following manner.

Each of the image-receiving materials on which the image had been formed was respectively irradiated with xenon light at 80,000 lux for 8 hours. And then, the durability (discoloration) was evaluated by measuring the density of the color image after the irradiation and comparing the density with that before the irradiation.

The results are set forth in Table 2. In Table 2, "Remaining Ratio after Irradiation" means the ratio of the density of the color image after the irradiation to that before the irradiation.

TABLE 2

| Light-sensitive Material | Leuco Dye | Maximum Density | Remaining Ratio after Irradiation |
|---|---|---|---|
| (A) | (1) | 1.50 | 96% |
| (B) | (2) | 1.40 | 95% |
| (C) | (3) | 1.35 | 95% |

TABLE 2-continued

| Light-sensitive Material | Leuco Dye | Maximum Density | Remaining Ratio after Irradiation |
|---|---|---|---|
| (D) | (4) | 1.39 | 94% |
| (E) | (5) | 1.43 | 93% |
| (F) | (17) | 1.41 | 94% |
| (G) | (27) | 1.41 | 96% |
| (H) | (33) | 1.30 | 90% |
| (I) | (35) | 1.32 | 89% |
| (J) | (38) | 1.15 | 93% |
| (K) | (41) | 1.51 | 99% |
| (L) | (42) | 1.55 | 98% |
| (M) | (a) | 0.87 | 77% |
| (N) | (b) | 0.81 | 63% |

It is apparent from the results in Table 2 that each of the light-sensitive materials (A) to (L) according to the present invention forms an improved positive image which has a high maximum density and satisfactory durability to exposure to light compared with the light-sensitive materials (M) and (N) containing the leuco dye (a) and (b), respectively, which are excluded from the leuco dyes of the invention.

We claim:

1. A recording material comprising a layer containing a leuco dye on a support, wherein the leuco dye has the formula (I):

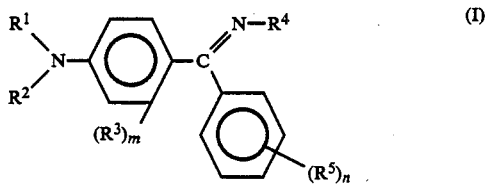

in which each of $R^1$ and $R^2$ independently is a monovalent group selected from the group consisting of an alkyl group, a cycloalkyl group and an aryl group, or $R^1$ and $R^2$ may form, together with the neighboring nitrogen atom, a heterocyclic ring; $R^3$ is a monovalent group selected from the group consisting of a halogen atom, an alkyl group, an aryl group, an alkoxy group and an aryloxy group; $R^4$ is a monovalent group selected from the group consisting of an aryl group and a hetrocyclic group; $R^5$ is a monovalent group selected from the group consisting of a halogen atom, an acyloxy group, an acyl group, carbamoyl, sulfamoyl, an alkylsulfonylamino group, an arylsulfonylamino group, an acylamino group, amino, hydroxyl, nitro, cyano, an alkyl group, an aryl group, an alkoxy group, an aryloxy group, an alkoxycarbonyl group, an aryloxycarbonyl group, an alkylsulfonyl group and an arylsulfonyl group; each of $R^1$, $R^2$, $R^3$, $R^4$ and $R^5$ may have one or more substituent groups; m is 0 or 1; n is 0, 1, 2, 3, 4 or 5; when n is 2, 3, 4 or 5, the groups represented by $R^5$ may be different from each other.

2. The recording material as claimed in claim 1, wherein the leuco dye has the formula (II):

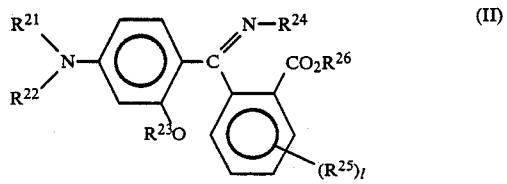

in which each of $R^{21}$, $R^{22}$, $R^{23}$ and $R^{26}$ independently is a monovalent group selected from the group consisting of an alkyl group, a cycloalkyl group and an aryl group, or $R^{21}$ and $R^{22}$ may form, together with the neighboring nitrogen atom, a heterocyclic ring; $R^{24}$ is a monovalent group selected from the group consisting of an aryl group and a heterocyclic group; $R^{25}$ is a monovalent group selected from the group consisting of a halogen atom, an alkyl group and an aryl group; each of $R^{21}$, $R^{22}$, $R^{23}$, $R^{24}$, $R^{25}$ and $R^{26}$ may have one or more substituent groups; l is 0, 1, 2, 3 or 4; and when l is 2, 3 or 4, the groups represented by $R^{25}$ may be different from each other.

3. The recording material as claimed in claim 1, wherein the recording material is a pressure-sensitive recording material.

4. The recording material as claimed in claim 1, wherein the recording material is a heat-sensitive recording material.

5. The recording material as claimed in claim 1, wherein the recording material is a light-sensitive recording material.

6. The recording material as claimed in claim 1, wherein the recording material is a light-sensitive recording material, and the layer containing the leuco dye further contains silver halide, a reducing agent and an ethylenic unsaturated polymerizable compound.

7. The recording material as claimed in claim 1, wherein the leuco dye is contained in microcapsules which are dispersed in the layer on the support.

8. The recording material as claimed in claim 1, wherein the layer further contains an organic solvent.

9. The recording material as claimed in claim 1, wherein the layer containing the leuco dye further contains an organic solvent, the amount of said leuco dye ranging from 2 to 20 weight % based on the amount of the organic solvent.

10. The recording material as claimed in claim 1, wherein the leuco dye is contained in microcapsules which are dispersed in the layer on the support, said microcapsules further containing an organic solvent.

11. The recording material as claimed in claim 1, wherein the leuco dye is contained in microcapsules which are dispersed in the layer on the support, said microcapsules further containing an ethylenic unsaturated polymerizable compound.

12. The recording material as claimed in claim 1, wherein the leuco dye is contained in the layer in a coating amount of 0.01 to 1 g/m².

* * * * *

UNITED STATES PATENT AND TRADEMARK OFFICE
CERTIFICATE OF CORRECTION

PATENT NO. : 4,888,322

DATED : December 19, 1989

INVENTOR(S) : Naoki SAITO; Toru HARADA

It is certified that error appears in the above-identified patent and that said Letters Patent is hereby corrected as shown below:

On title page, paragraph [30] under "Foreign Application Priority Data" delete "Jul. 8, 1987 [JP]" and insert -- Aug. 7, 1987 [JP] --.

Signed and Sealed this

Nineteenth Day of February, 1991

*Attest:*

HARRY F. MANBECK, JR.

*Attesting Officer*          *Commissioner of Patents and Trademarks*